United States Patent [19]
Goodman

[11] Patent Number: 5,306,902
[45] Date of Patent: Apr. 26, 1994

[54] CONFOCAL METHOD AND APPARATUS FOR FOCUSING IN PROJECTION LITHOGRAPHY

[75] Inventor: Douglas S. Goodman, Yorktown Heights, N.Y.

[73] Assignee: International Business Machines Corporation, Armonk, N.Y.

[21] Appl. No.: 939,208

[22] Filed: Sep. 1, 1992

[51] Int. Cl.$^5$ ............................................. G01V 1/20
[52] U.S. Cl. .............................. 250/201.3; 359/368
[58] Field of Search ......................... 250/201.3, 201.4; 356/1, 4; 359/383, 368

[56] References Cited

U.S. PATENT DOCUMENTS

| | | | |
|---|---|---|---|
| 3,912,922 | 10/1975 | Lacotte et al. | 250/204 |
| 4,447,717 | 5/1984 | Nohda | 250/201 |
| 4,472,055 | 9/1984 | Tsutsumi | 356/375 |
| 4,556,787 | 12/1985 | Shishido et al. | 250/201 |
| 4,567,362 | 1/1986 | Kunz | 250/201 |
| 4,634,880 | 1/1987 | Lindow et al. | 250/566 |
| 4,686,360 | 8/1987 | Gorgon | 250/201 |
| 4,737,622 | 4/1988 | Shishido et al. | 250/204 |
| 4,798,948 | 1/1989 | Neumann et al. | 250/201 |
| 4,844,617 | 1/1989 | Kelderman et al. | 356/372 |
| 4,845,352 | 7/1989 | Benschop | 250/201.3 |
| 4,863,226 | 9/1989 | Houpt et al. | 350/6.5 |
| 4,945,220 | 7/1990 | Mallory et al. | 250/201.3 |
| 4,952,816 | 8/1990 | Dunning | 250/560 |
| 4,958,920 | 9/1990 | Jorgens et al. | 250/201.3 |
| 4,965,441 | 10/1990 | Picard | 250/201.3 |

FOREIGN PATENT DOCUMENTS

| | | | |
|---|---|---|---|
| 58-63906 | 4/1983 | PCT Int'l Appl. | G02B 7/11 |
| 61-272714 | 12/1986 | PCT Int'l Appl. | G02B 26/10 |
| 62-36624 | 2/1987 | PCT Int'l Appl. | G02B 21/00 |
| WO9001716 | 2/1990 | PCT Int'l Appl. | G02B 21/00 |

Primary Examiner—David C. Nelms
Attorney, Agent, or Firm—Heslin & Rothenberg

[57] ABSTRACT

A through-the-lens method and system for focusing a projected image onto an imaging surface employs a confocal process and apparatus. Electromagnetic radiation projected through a subresolution aperture of origin located in an object plane passes through a confocal imaging device which forms an image of the aperture in the image plane. The radiation strikes the surface and is reflected back through the confocal imaging device to the aperture. The power of reflected radiation passing through the aperture is detected/measured. The distance between the imaging surface and the imaging device is then adjusted to maximize the detected power.

32 Claims, 7 Drawing Sheets

CONFOCAL METHOD AND APPARATUS FOR FOCUSING IN PROJECTION LITHOGRAPHY

TECHNICAL FIELD

This invention generally relates to projection lithography especially as applied to semiconductor integrated circuit fabrication, and, more particularly, to a method and apparatus for focusing the image of a pattern or mask projected onto a photosensitive layer such as a photoresist layer on a semiconductor wafer during the integrated circuit fabrication process.

BACKGROUND ART

The Problem

Each step in the process of fabrication of a semiconductor integrated circuit requires precision given the small size scale. Focusing, during projection lithography, of the image of a mask projected by a lens or other imaging device onto a photoresist layer located on top of a wafer, as with other steps, requires a high degree of accuracy. Although the surface of the photoresist layer is generally planar, enough significant variations in surface profile exist to create focusing problems.

Typically, the wafer has multiple locations at which fabrication of integrated circuits occurs. Present day technology and the unevenness of the photoresist layer on the wafer only allow exposure of one or two chip sites at a time, although many more integrated circuit locations exist on the wafer. Consequently, the wafer used in the process is normally moved to expose the photoresist layer at each location. The movement of the wafer during the fabrication process and the inherent unevenness of the photoresist surface necessitate the refocusing of the image of the mask on the photoresist surface with each move.

Current Methods of Focusing

Focusing of the projected image of the mask entails making the top surface of the photoresist layer located on the wafer surface at a particular chip site on the wafer coincident with the image plane of the projection lithography system.

Currently, the industry uses several methods to focus the image of a mask onto a photoresist layer located on a wafer. All of the currently used systems require some form of calibration.

The need to calibrate these systems requires additional steps and adds further complexity to an already complex and difficult process. This additional complexity naturally creates the possibility of errors and defects. Most of the calibration techniques, as is well known in the art, require test exposures on a dummy site or set of dummy sites and the examination of the dummy site or set of dummy sites to determine preciseness of focus.

In one such system, light is projected from the side of the mask imaging lens onto the wafer at an oblique angle. The light upon striking the wafer then reflects back off at a oblique angle towards an optical system with a detector. Changes in the distance between the photoresist layer on the wafer surface and the imaging lens changes the position where the light projected by the oblique technique strikes the detector. Once calibrated, the oblique system can provide a precise focus of the image of the mask. However, given the extremely close proximity of the imaging lens and the photoresist layer required by the lithographic process, this method can prove difficult at times to implement and in some situations impossible to use.

Another method of focusing uses air gauges. With this system, air or another gas is blown onto the wafer and measured variations in back pressure caused by differences in distance between the photoresist layer and the imaging lens provide feedback for focusing. However, in addition to requiring calibration, this system can introduce dust particles or other debris that can create errors or defects.

The third procedure for focusing uses capacitive gauges. The capacitive gauge senses changes in capacitance caused by changes in distance between the photoresist surface and lens. Once calibrated, the system can determine the appropriate focus distance between the lens and the photoresist layer located on top of the wafer. However, with this system, differences in capacitance due to differences in the structure of the chip sites or changes from one process step to the next make calibration difficult.

All of the currently used focusing systems may require recalibration while operating if substantial changes in ambient air pressure occur during the fabrication process. Changes in air pressure cause changes in the refractive index of air which tend to defocus the imaging system, requiring adjustment of the distance between the lens and photoresist layer until the image plane and the photoresist layer are again coincident.

Confocal Imaging

The confocal imaging principal has been known for some time, but it has not heretofore been suggested that this principal could be applied to overcome the limitations of current focusing techniques in projection lithography. The confocal principal has been used primarily on devices related to confocal microscopy and profilometry. These systems generally focus a coherent collimated beam of light such as that produced by a laser or light from a subresolution aperture on a very tiny spot on the specimen to be examined. The reflected image from the specimen passes back through the optical system to a detector wherein the specimen reflectance can be utilized to inspect or measure various surface features of the specimen such as surface irregularities, profile, line widths etc. The system usually employs a scanning type of imaging procedure that builds up an image based on information obtained sequentially by a series of line or spot scans. U.S. Pat. No. 4,863,226 describes one of confocal scanning microscope. U.S. Pat. No. 4,844,617 describes one form of a profilometer.

DISCLOSURE OF THE INVENTION

The present invention provides a highly sensitive method and apparatus for focusing of an image of an object projected onto a surface which method and apparatus does not require calibration. The present invention in one aspect provides a through-the-lens focusing technique which immediately responds to changes which affect the focus of the object to be imaged, e.g. ambient air pressure variations.

The present invention additionally provides a focusing apparatus and method that can continuously operate while an image of an object projects onto a surface to keep the image of the object in focus on the surface. The invention is applicable to various types of projection lithography schemes including step and repeat, scanning type, and pulsed radiation source, and avoids the danger of photoresist overexposure.

According to the principles of the present invention, apparatus for focusing an image of an object projected by object imaging means onto an imaging surface is provided. The apparatus includes: an electromagnetic radiation barrier having a subresolution aperture therethrough; means for projecting electromagnetic radiation through the aperture towards the imaging surface; confocal imaging means for forming from the projected radiation an image of said aperture in an image plane of the object imaging means, part of the projected radiation reflecting back from a localized region of the imaging surface through the confocal imaging means and the aperture; means for detecting the power of radiation reflected back through the aperture; and means for adjusting the distance between the object imaging means and the imaging surface to maximize the detected power. Preferably, the electromagnetic radiation barrier having the subresolution aperture is located in the same plane as the object. The confocal imaging means preferably comprises the object imaging means, and the electromagnetic radiation projected through the aperture preferably is of the same frequency as the radiation which forms the image of the object. The same source of radiant energy can be employed to irradiate the object and the aperture.

The invention is advantageously applied to projection lithography for fabrication of semiconductor integrated circuits on a wafer. In this application, the object comprises a mask and the imaging surface is a photoresist layer on the wafer. The localized region of the imaging surface may comprise a sacrificial region of an integrated circuit site or the kerf region between adjacent integrated circuit sites. The radiation projected through the aperture can have a power below an exposure threshold of the photoresist layer, or the radiation can be projected through a series of subresolution apertures and the reflected radiation passing through the apertures combined and sensed to avoid the risk of overexposure of the photoresist layer.

In a further aspect of the present invention, the apparatus may comprise a plurality of subresolution apertures located in the object plane; means for projecting radiation through each of said apertures; confocal imaging means for forming an image of each of said apertures in the image plane of the object imaging means; and means for detecting the power of radiation reflected back through each of the apertures. The distance between the object imaging means and the imaging surface can then be adjusted to maximize the detected power of radiation reflected back through all of the apertures.

In a still further aspect of the present invention, the reflected radiation detecting means may include means for distinguishing between reflected radiation originating from the aperture and other radiation, e.g. from the image of the object. The radiation projected through the aperture may be pulsed or chopped to produce a periodic variation in intensity and the detecting means may comprise synchronous detection means synchronized with the radiation pulsing or chopping means. If the image of the object is formed from radiant energy emanating from a pulsed source, the radiation projected through the aperture can be pulsed at a rate different from but synchronized with the pulse rate of the radiant energy source. These approaches allow operation of the confocal focusing apparatus of the present invention simultaneously with the projection lithography system.

In yet another aspect, the confocal focusing apparatus of the present invention can be employed to calibrate another non-confocal focusing mechanism such as an oblique focus system, a capacitive gauge or an air gauge.

The present invention also encompasses a method for focusing an image of an object projected by object imaging means onto an imaging surface. The method includes the steps of: forming an image of a subresolution aperture in an image plane of the object imaging means; and bringing a localized region of the imaging surface into coincidence with the image of said aperture. The image of the aperture is formed by projecting electromagnetic radiation from the aperture through confocal imaging means. The power of radiation reflected back from the localized region of the imaging surface through the aperture is detected, and the distance between the object imaging means and the imaging surface is adjusted to maximize the detected power. Preferably, the aperture is located in the object plane; the image of the aperture is formed by the object imaging means; and the same frequency of electromagnetic radiation is employed to form the image of the aperture and the image of the object. Most preferably, images of multiple subresolution apertures are formed in the image plane of the object imaging means.

The invention facilitates focusing of an image of a mask projected by object imaging means onto a photoresist layer during a photolithographic process. This method includes the steps of: projecting mask exposure electromagnetic radiation through at least one subresolution aperture located in an electromagnetic radiation barrier located in the plane of the mask; passing the radiation through an electromagnetic radiation imaging device onto a photoresist layer, the imaging device forming an image of the aperture in an image plane of the object imaging means; reflecting a portion of the radiation off the photoresist layer so that it retraces its path back through the imaging device in the aperture; detecting the power of radiation reflected back through the aperture; and adjusting the distance between the photoresist layer and the object imaging means to maximize the detected power of radiation.

BRIEF DESCRIPTION OF DRAWINGS

The foregoing and other aspects, features and advantages of the invention will be apparent from the following more particular description of preferred embodiments of the invention, as illustrated in the accompanying drawings in which.

DETAILED DESCRIPTION

Introduction

Figure 1:
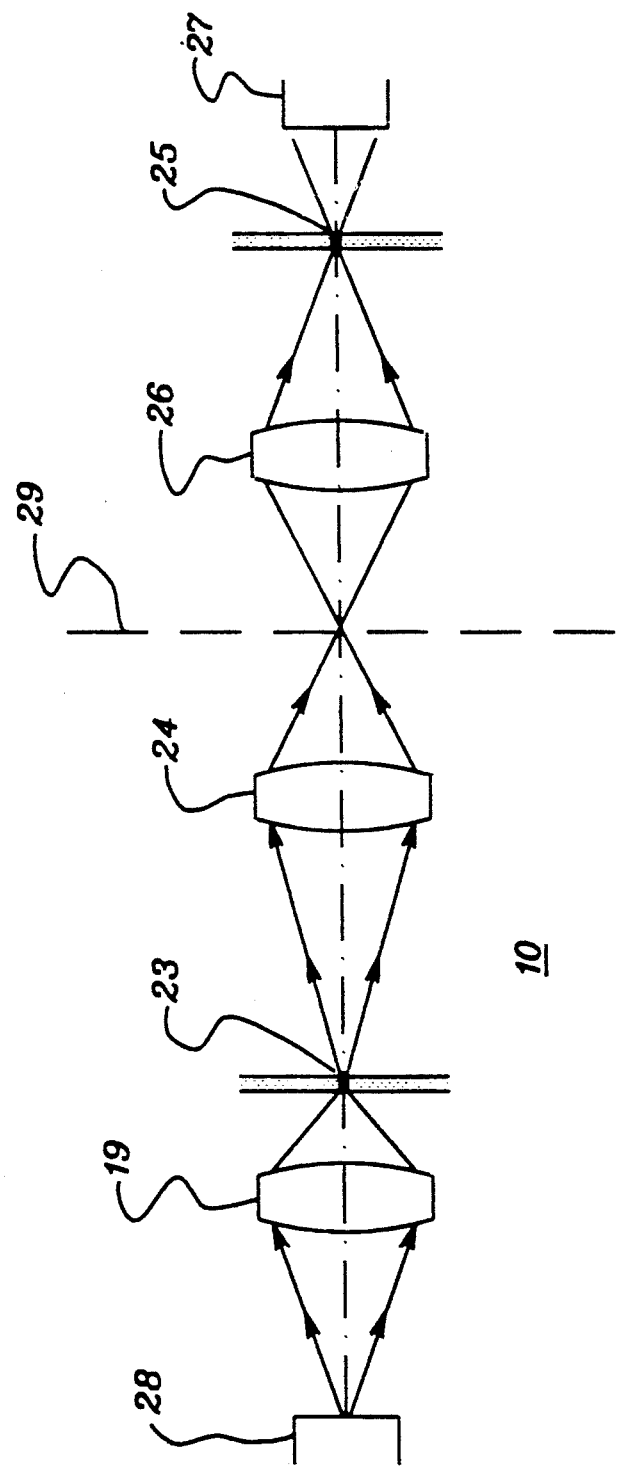
FIG. 1 provides a schematic representation of an unfolded or transmissive confocal system.

Before presentation of a detailed description of embodiments of the present invention, a discussion of salient features of the confocal principal and their application in the present invention will assist in understanding the invention. FIG. 1 depicts schematically a transmissive or unfolded confocal system 10. Electromagnetic radiation from a source of electromagnetic radiation 28 passes through lens 19 to focus the radiation on a subresolution aperture of origin 23. As is well known in the art, subresolution aperture 23 is small in size compared to the wavelength of the electromagnetic radiation divided by the numerical aperture of lens 24 on the side facing aperture 23. The subresolution aperture may, for example, comprise a "pinhole" or a narrow slit. When light passes through the subresolution aperture of origin 23 diffraction spreads it out to the extent that the light enters lens 24 in a substantially uniform pattern. Lens 24 then brings the electromagnetic radiation to a focus in image plane 29. From plane 29 the electromagnetic radiation again spreads out and then upon striking image lens 26 the electromagnetic radiation is refocused at 25 a conjugate subresolution aperture of aperture 23. Aperture 25 is small compared to the wavelength of the electromagnetic radiation divided by the numerical aperture of the side of lens 26 facing aperture 25. Detector 27 then detects the power of light passing through aperture 25. (The term "detection" is used broadly in this description to include sensing, determining, measuring and the like.) When the elements of system 10 have been properly positioned as shown in FIG. 1, detector 27 will detect a maximum amount of electromagnetic radiation power. Movement of any of the elements of the confocal system 10, such as the subresolution apertures or the lenses, will cause a loss of focus and a corresponding decrease in electromagnetic radiation power detected by detector 27.

Figure 2C:
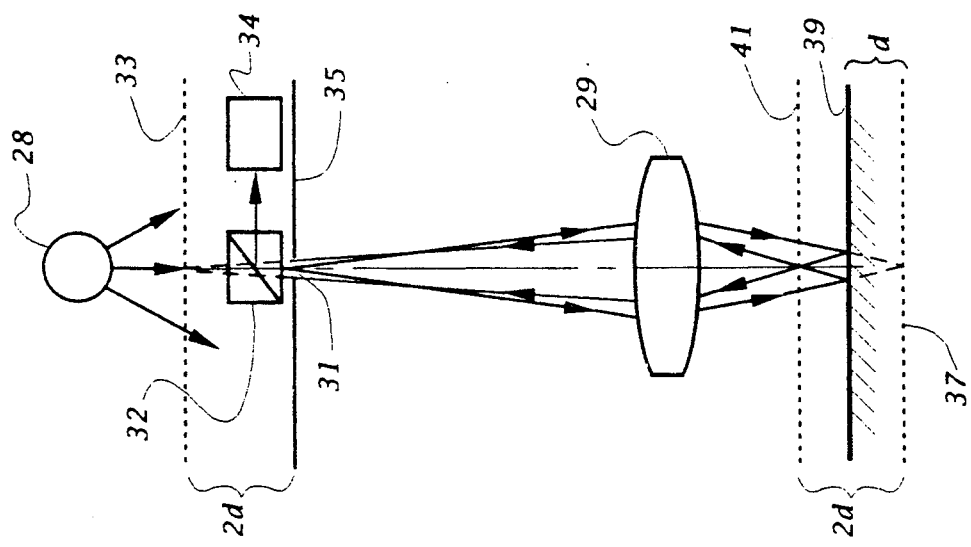
FIG. 2c depicts a reflective confocal focusing system at another out-of-focus position.
Figure 2B:
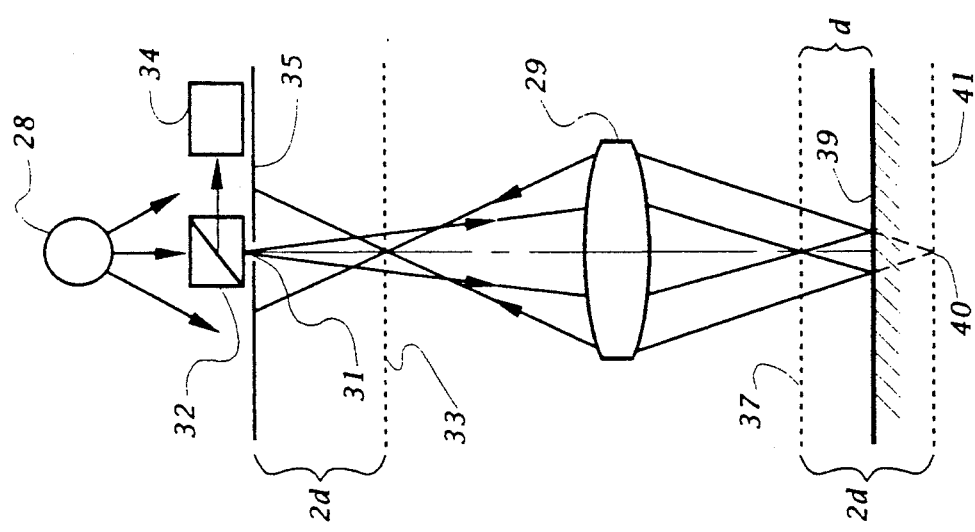
FIG. 2b depicts a reflective confocal focusing system at an out-of-focus position.
Figure 2A:
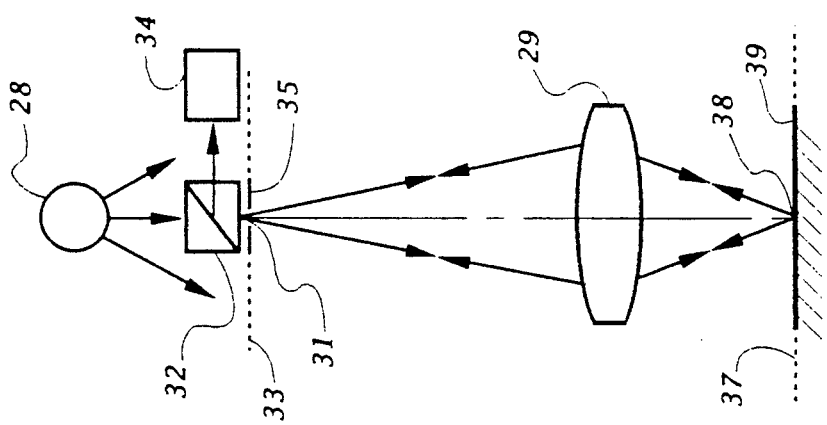
FIG. 2a depicts a reflective confocal focusing system at an in-focus position.

FIG. 2A depicts an in-focus folded reflective confocal system of the type used in accordance with the principles of the present invention. Electromagnetic radiation source 28 projects electromagnetic radiation, generally of a single frequency or narrow range of frequencies, through a beam splitter 32 which passes the electromagnetic radiation on through subresolution aperture of origin 31. The transmitted radiation strikes lens 29 which focuses the radiation at a focal point 38 in an image plane 37. When focal point 38 coincides with a localized region on a surface 39, the system is in focus. Surface 39 has reflective qualities which reflect a portion of the radiation back through lens 29. The reflected radiation comes to a focus in reflected image plane 33 which is coincident with the subresolution aperture of origin 31 in object plane 35. Beam splitter 32 then directs the reflected radiation passing back through aperture 31, to detector 34. While the system remains in focus, detector 34 will detect the maximum possible reflected radiation given the reflective quality of surface 39 and the quality of lens 29.

FIG. 2B depicts the result of increasing the distance between the surface 39 and the lens 29. The image plane 37 created by radiation projected through subresolution aperture 31 and lens 29, no longer coincides with surface 39. Consequently, after the radiation reflects off of surface 39 and passes back through lens 29, the position of reflected image plane 33 has changed. Thus, when the radiation finally reaches object plane 35, it has spread out, no longer being in focus. Thus, only a portion of the reflected radiation passes through aperture 31. Detector 34 then detects a decrease in the power of light from the maximum detected when the system is in focus.

FIG. 2C depicts the results of moving surface 39 closer to lens 29 than image plane 37. Radiation reflected back through lens 29 by surface 39 has an actual reflected focus position on reflected image plane 33 which now lies beyond object plane 35. Thus, the returning beam of light is spread out and only a portion of it transmits through subresolution aperture 31 in object plane 35. Consequently, detector 34 detects a decrease in the reflected radiation.

Thus, by adjusting the position of surface 39 relative to lens 29 until the detector 34 provides a reading of maximum power, a precise coincidence of focal point 38 and a localized region of surface 39 can be achieved. In accordance with the principles of the present invention, this reflective confocal approach is advantageously applied to focus a lithographic projection system. The subresolution aperture 31 is located in the same plane as the object to be imaged, such as a mask, and radiation of the same frequency as that used to image the object is projected through the subresolution aperture 31. In the preferred embodiment, the same lens images both the object and the aperture 31 making the confocal system a "through the lens system". Thus, the image plane of the object and that of the subresolution aperture are the same, namely image plane 37. Consequently, the system does not require calibration since the object exposure radiation in conjunction with the confocal apparatus determines the precise point of focus or location of coincidence of the image plane 37 and surface 39. Alternative embodiments could be constructed with separate lenses to image the object and subresolution aperture.

Application To Wafer Lithography

Although the following description of preferred embodiments uses examples based on wafer lithography, those skilled in the art will readily realize the system has equal application to all types of projection lithography. These would include but not be limited to fabrication of liquid crystal display screens, integrated circuit chip packages and modules, and circuit boards.

Figure 3:
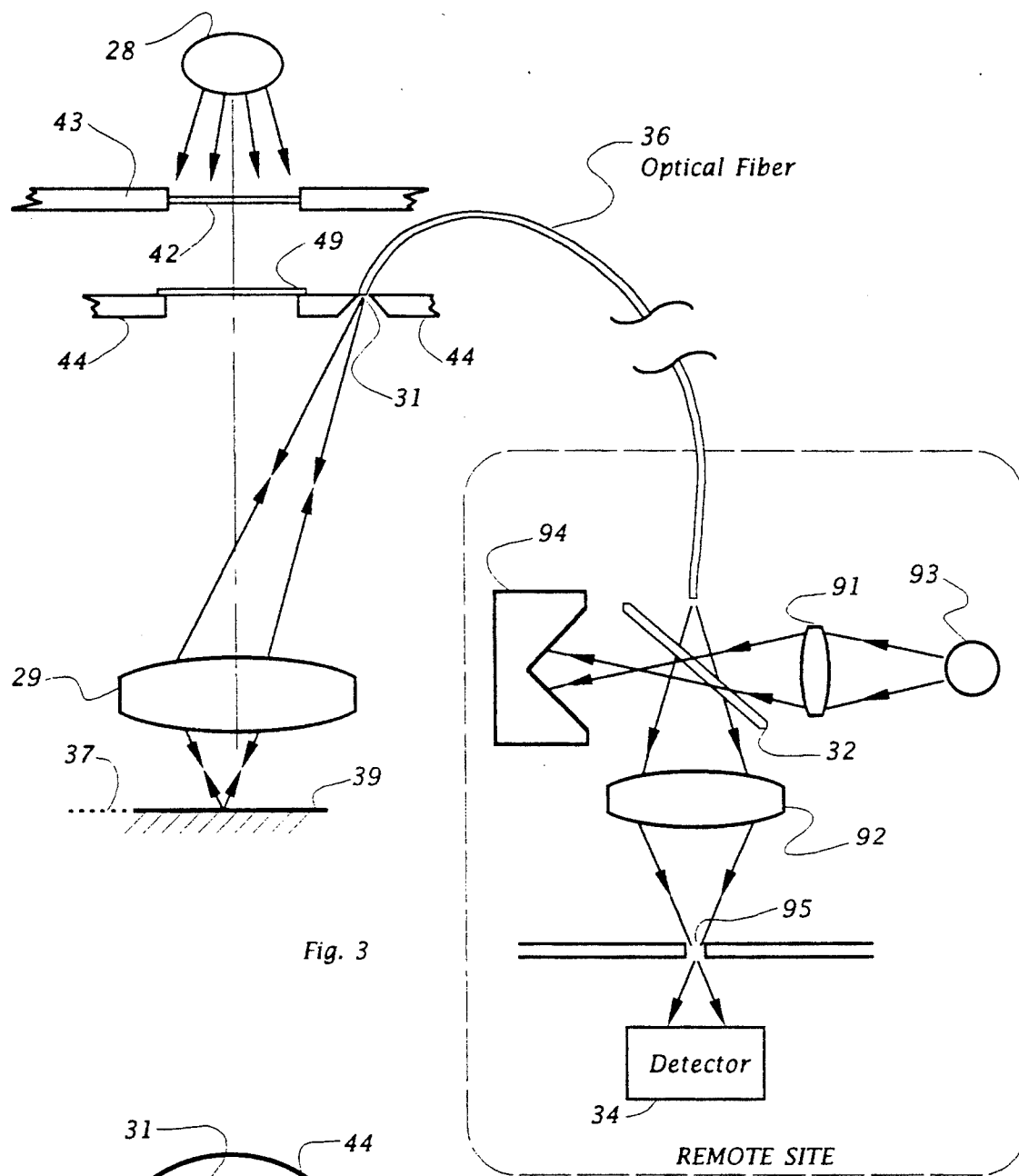
FIG. 3 depicts the application of a reflective confocal focusing system to a projection lithographic device in accordance with the principles of the present invention.

FIG. 3 depicts the invention incorporated into apparatus used for wafer lithography. The confocal system depicted in FIG. 3, has a "through the lens" configuration with all the inherent advantages of such a structure. Since the same lens 29 and electromagnetic radiation of the same frequency are used to image both the aperture 31 and the mask 49 which lie in the same plane 35, no matter what distance exists between the lens 29 of the lithographic apparatus and object plane 35, images of the aperture 31 and mask 49 will always lie in a common image plane 37.

When electromagnetic radiation of an appropriate frequency projects from radiation source 28 through the mask 49, an image of the mask is formed at image plane 37 by lens 29. The position of image plane 37 depends upon the characteristics of lens 29, and the separation of masks 49 and lens 29. Coincidence of image plane 37 and surface 39 occurs upon a proper focusing of the system as determined by the associated confocal focusing apparatus. Surface 39 represents the top surface of a wafer supported photosensitive layer, such as a photoresist layer. (The terms "photosensitive" and "photoresist" are used herein in the generic sense to connote a material responsive to light or other electromagnetic radiation.) Housing 43 encloses the electromagnetic radiation source 28. A diaphragm or lens stop 42 provides a shutter type mechanism, well known in the art, to control passage of electromagnetic radiation from source 28 to mask 49. Auxiliary optics (not shown) may be located along the optical path between source 28 and mask 49, as is common in the art.

Although radiation of the same frequency images both the aperture and mask in the preferred embodiment depicted in FIG. 3, the sources of radiation differ. Source 28 provides radiation to image the mask and source 93 provides radiation to image the aperture 31. Most sources of radiation used in wafer lithography which produce radiation at the same frequency, such as mercury arc lamps, produce radiation which is indistinguishable. The radiation produced by source 93 strikes beam splitter 32 which reflects approximately half of the radiation up to fiber optic cable 36. Fiber optic cable 36 then directs the radiation through aperture 31. Light trap 94 absorbs any radiation from source 93 not reflected up to the cable 36 by beam splitter 32.

Platen 44, which contains subresolution aperture 31, supports the mask 49 and lies in the same plane as the mask. The electromagnetic radiation passing through subresolution aperture 31 strikes lens 29 and comes to a focus at image plane 37. As noted, because of the through the lens nature of the system, the image of the mask 49 and the image of the aperture 31 always lie in common at image plane 37. A portion of the incident electromagnetic radiation from aperture 31 reflects back off of surface 39 and passes through lens 29 and subresolution aperture 31. Fiber optic cable 36 then directs the radiation back to beam splitter 32. Approximately half of the radiation passes through beam splitter 32 to lens 92 which focuses the radiation through aperture 95 onto detector 34. Aperture 95 serves to reduce impingement of stray light on detector 34. Use of the above scheme allows for placement of the detector 34 at a remote site.

Once the system has achieved focus, i.e. when image plane 37 and the localized region of surface 39 become coincident, detector 34 receives the maximum power of reflected light from surface 39. Thus, movement of surface 39 to a position at which maximum power is detected, assures a precise focusing of image plane 37 on surface 39 without the need for calibration; the nature of the system assuring a precise focus.

The preferred embodiment depicted uses a lens 29 to create the image plane 37 for both the mask and aperture. However, those skilled in the art will readily perceive that other types of refractive or reflective imaging devices can accomplish the same result when appropriately configured. The electromagnetic radiation used to image the mask may consist of light, infrared or ultraviolet radiation or even soft x-rays.

In implementing the preferred embodiment of FIG. 3, establishment of the distance between the platen 44 and lens 29 would occur first by means well known in the art. The necessary magnification of the projected image of the mask and the characteristics of the lens determine the distance between the platen 44 and the lens 29. Actual magnification may comprise enlargement of the image created by projection of the mask, reduction in size of the image created by projection of the mask, or production of an image of the same size as the mask.

Given the nature of the equipment and process, the system operates more efficiently when surface 39 moves in relation to the lens to achieve proper focus. Thus, the mask and lens remain in a fixed relationship while surface 39, at the top of the wafer supported photoresist layer, moves in relationship to the lens 29, i.e. towards or away from the lens to achieve proper focusing. Alternatively the imaging apparatus i.e. mask, lens etc., could move in relation to the wafer to create a focused image of the mask on the photoresist layer.

Appropriate devices and instruments well known in the art can provide the mechanism by which the readings obtained by the detector 34 control the relative movement and positioning of the wafer and imaging apparatus to achieve focus i.e. coincidence of the image plane 37 and the localized region of the photoresist layer 39.

Figure 4:
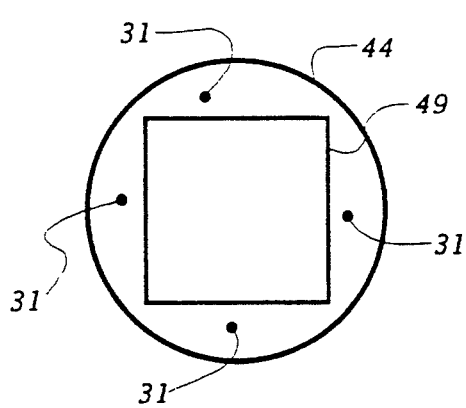
FIG. 4 provides a plan view of a platen in which four subresolution apertures for a confocal focusing system have been incorporated.

The confocal system described so far seeks to assure proper focusing through coincidence of a single focused point and the photoresist layer; however, it is desirable to assure complete coincidence of image plane 37 and a localized region of surface 39. Consequently, the preferred system uses at least three subresolution apertures located in the plane of the mask. The apertures can be located on the platen or on the mask itself. FIG. 4 is a plan view of a portion of the platen 44 and mask 49 with four subresolution apertures 31 located on the platen 44. The radiation reflected back through the subresolution apertures is combined by a detector which senses the total intensity of the radiation and adjusts surface 39 by well known techniques to assure complete coincidence of the localized region of surface 39 and image plane 37. The use of the three or more subresolution apertures functions on the well known geometric principal that three or more points define a plane.

The system of the present invention will not be adversely affected by defocusing effects of changes in ambient air pressure. The system, given its through the lens nature, automatically corrects for changes in the refractive index due to changes in air pressure.

The reflective confocal system of the present invention has a sensitivity doubling effect. Referring to FIG. 2a, when the image plane 37 and the surface 39 are coincident, the rays projecting from aperture 31 to image plane 37 demonstrate the in-focus path of the electromagnetic radiation. However, as depicted in FIG. 2b, upon movement of surface 39 a distance "d" away from image plane 37, a virtual image 40 of aperture 31 forms at virtual image plane 41. The virtual image plane 41 as indicated lies at a position a distance "2d" from the in-focus position of image plane 37. Likewise, reflected image plane 33 is a distance "2d" from the object plane 35. FIG. 2c depicts the same effect when surface 39 moves towards the lens 29 to an out of focus position. The doubling of the effects of surface movements in and out of focus adds an enhanced sensitivity to the system making it more effective.

An additional aspect of the present invention not readily apparent will now be described. There is a general industry consensus that one cannot safely expose the photoresist layer to electromagnetic radiation of the same frequency as that used to project the image of the mask on to the photoresist layer. The primary concern being the obvious potential of overexposing the photoresist layer and thus introducing errors into the structures to be fabricated with the lithographic process. However, the system of the present invention allows the exposure of the photoresist layer to exposure wavelengths of electromagnetic radiation while avoiding overexposure of the photoresist layer. The intensities of electromagnetic radiation necessary to effectuate the present invention are below those necessary to expose the photoresist layer. For example, if a photoresist exposure threshold equals approximately $1 \times 10^{-6} J/CM^2$, a very fast rate, then at an exposure wavelength of 248 nanometers this requires $4 \times 10^7$ photons per square micrometer. Assuming that the reflectivity of the photoresist layer is 4%, then available photons for focus sensing are approximately $1.6 \times 10^6$ per square micrometer. Consequently, if only one percent of the photons reach the detector there are $1.6 \times 10^4$ photons available, a sufficient number, since this gives a photon-limited signal-to-noise ratio better than 100 to 1. A photo-multiplier, solid-state photo detector or similar device, all well known in the art, can be used for detection. The added sensitivity of the system of the present invention as noted above, with current capabilities of detectors allows use of intensities of radiation for focus determination below those necessary to cause exposure of the photoresist layer.

However, the current industry trend is to make the photoresist layer sensitive to reduced intensities of radiation. By reducing the intensity of light necessary to expose the photoresist layer, the overall time to complete the fabrication process decreases with a corresponding improvement in productivity. A number of enhancements can be made to the present invention which solve any potential problems of overexposure of the photoresist layer.

One solution involves dedication of a very small region of each integrated circuit site on the wafer as a "sacrificial region". Because of the pin point focusing of the confocal imaging process, only one to two square microns of surface area has to be exposed to implement the present invention. Given the fact that the area of most integrated circuit sites on the wafer varies from $10^6$ to $10^8$ square microns, the actual sacrificial area necessary is minuscule and thus use of such a region creates no appreciable loss of available surface area for the devices of the integrated circuit.

Figure 5A:
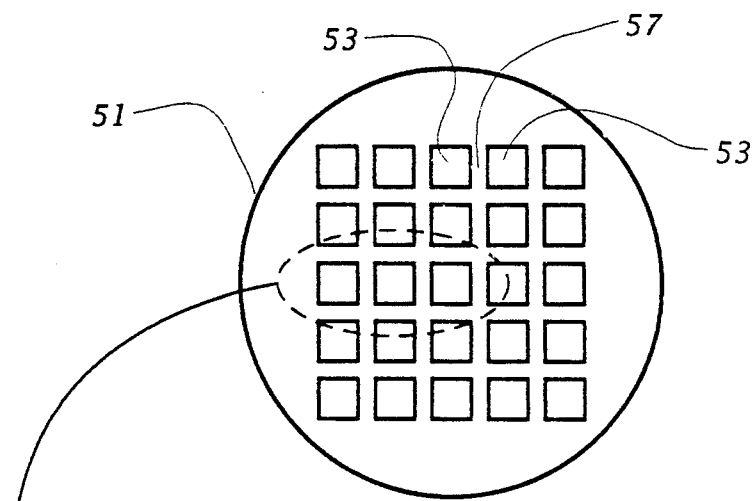
FIG. 5a depicts a plan view of a semiconductor wafer with integrated circuit sites located thereon.
Figure 5B:
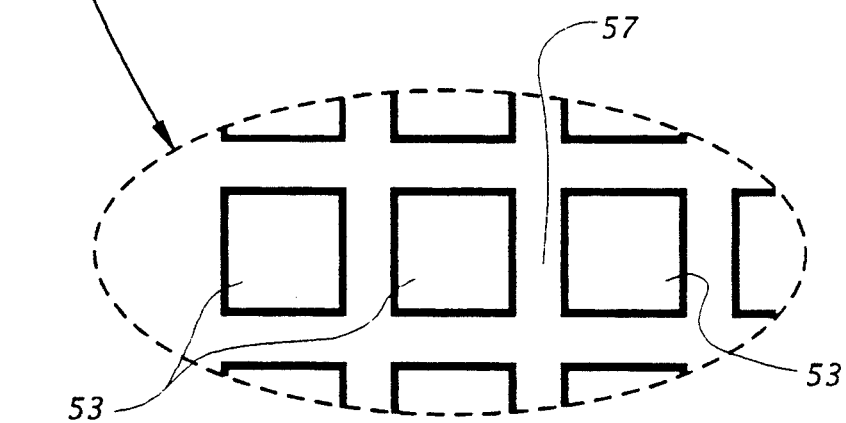
FIG. 5b provides a view of adjacent integrated circuit sites on a semiconductor wafer separated by a kerf region.

A second possible technique employs a portion of the kerf region as the "sacrificial region". FIG. 5A provides an overall illustration of a wafer 51 and various integrated circuit or chip sites 53 and the kerf 57 located between them. FIG. 5b depicts three integrated circuit sites 53 with the kerf 57 separating them. Upon completion of fabrication of the integrated circuits at sites 53, separation of the integrated circuits from each other occurs along the kerf. Thus exposure of the kerf to radiation during the focusing process has no negative effect on the integrated circuits. Also, a kerf region conveniently surrounds each integrated circuit site.

Figure 6:
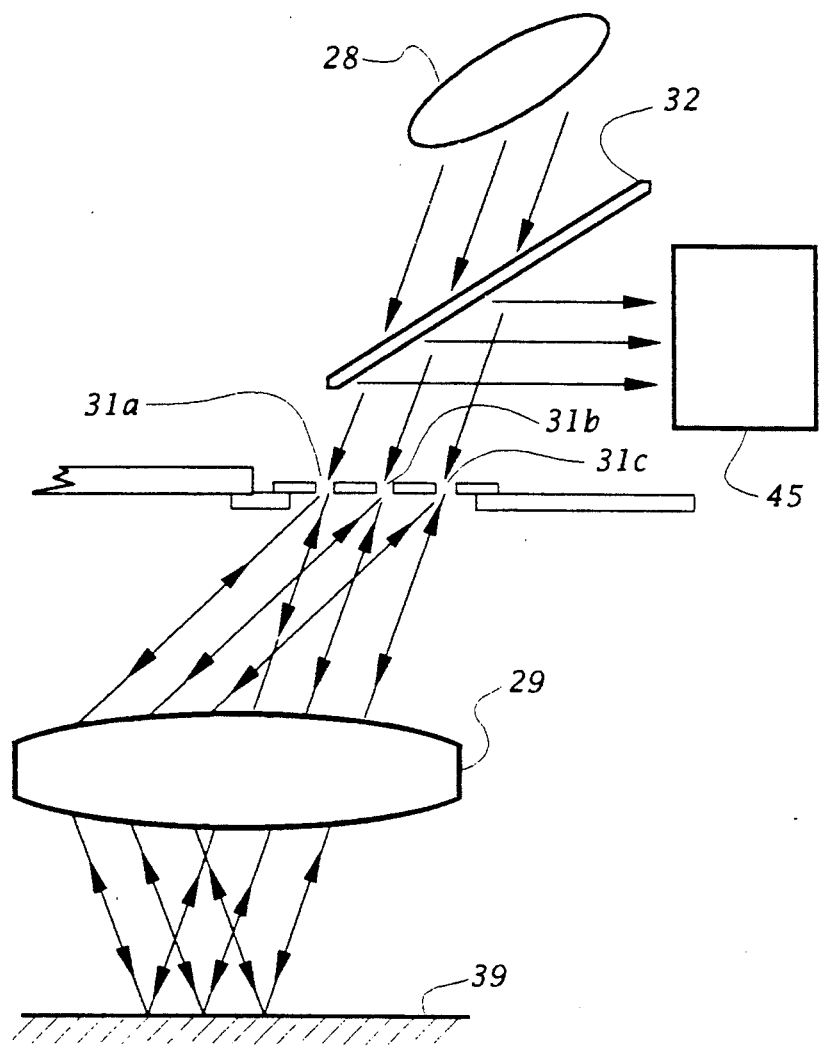
FIG. 6 depicts a portion of a device configured for projection lithography which incorporates confocal focusing apparatus with multiple subresolution apertures.

Another potential solution to the possible problem of overexposure of the photoresist entails the use of several neighboring subresolution apertures sufficiently separated so that radiation emanating from each aperture returns only through the same aperture (hereinafter such apertures are sometimes referred to as "reflectively separate".) Radiation projects through all of the subresolution apertures 31A to 31C simultaneously as depicted schematically in FIG. 6. The radiation passes through lens 29 then strikes surface 39 and reflects back through the lens 29 and the apertures 31A to 31C. Beam splitter 32 then diverts the radiation from each aperture to detector 45 which combines the readings received from all of the subresolution apertures 31A to 31C. The combined reflected radiation provides detector 45 with radiation of sufficient power to make appropriate readings for focusing while at the same time the actual exposure of the photoresist layer to the radiation has been spread out over a sufficiently large enough surface area of the photoresist layer to eliminate any possible over exposure effects on the photoresist layer. The number of apertures necessary for such a process depends upon the requisite power necessary for the detector and the threshold sensitivity of the photoresist layer to specific intensities of radiation, all easily determinable once the parameters of the system are known.

Figure 7:
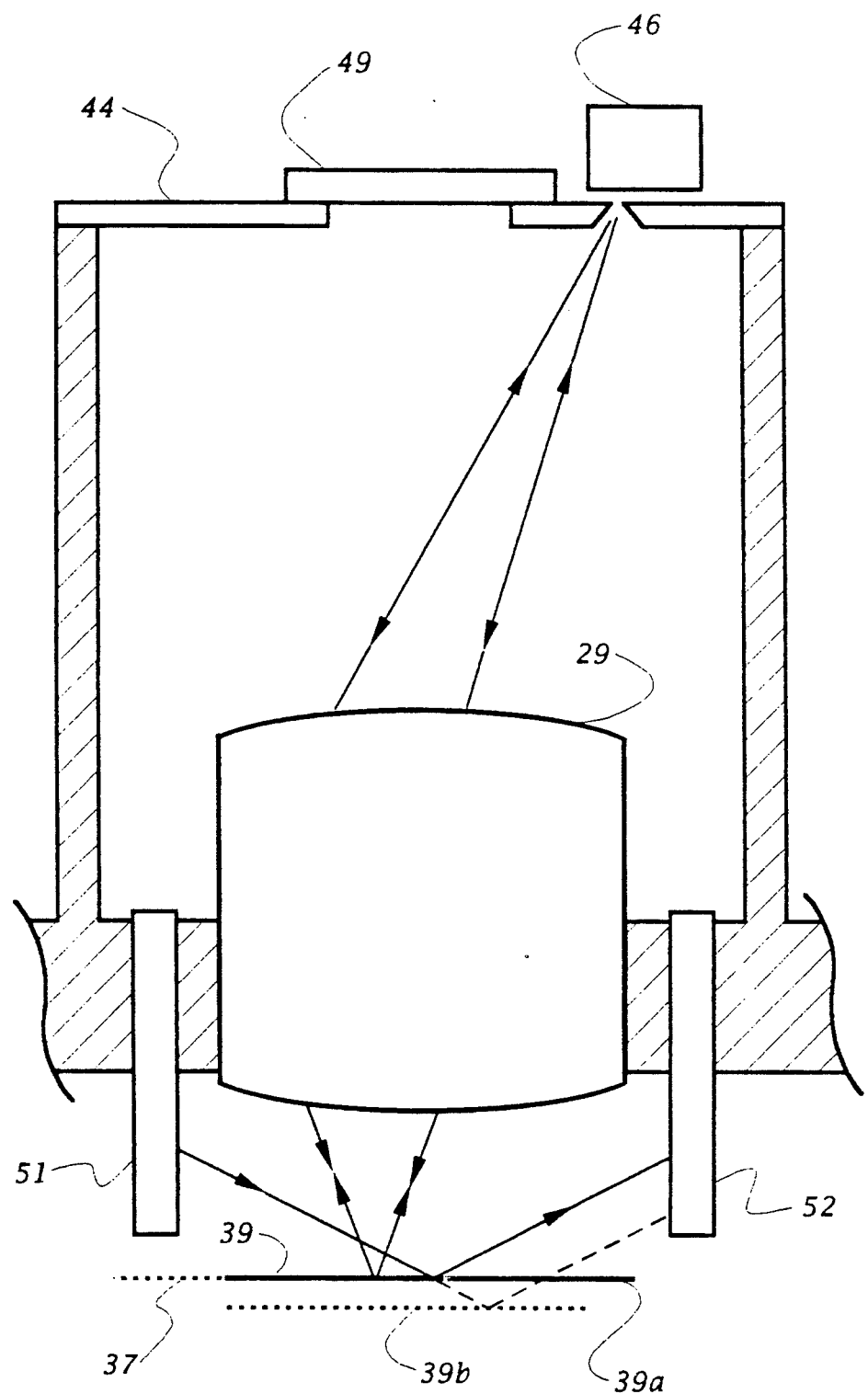
FIG. 7 illustrates use of the confocal focusing apparatus of the present invention to calibrate an oblique focusing mechanism.

Since the system of the present invention requires no calibration due to its unique application of the confocal principal, the system can be readily adapted to calibrate other systems used to focus. These other systems are nonconfocal focusing mechanisms. FIG. 7 depicts use of the present system to calibrate an oblique focusing system. In such a calibration system, a fixed spatial relationship would be established between the confocal apparatus 46 and the oblique focusing system with its radiation projector 51 and detection unit 52. Surface 39 would be moved, e.g. from position 39b, until it coincides with the image plane 37 as detected by the confocal system, at which position (39a) the reading provided by detection unit 52 would represent the in-focus position of the oblique focusing system. Thus, calibration of the oblique focusing system would result without the need for examination of test exposure sites. Likewise, the same process can effectively calibrate the capacitive and air gauge systems or other non-confocal focusing systems.

The system of the present invention has a high degree of flexibility which allows its use with a number of different lithographic fabrication processes currently in use. One such system referred to as the step and repeat system involves repositioning of the wafer to align the mask and image projecting system with each successive chip site on the wafer where an exposure of the mask occurs after initiation and completion of focus adjustment. In such a process, instead of waiting to activate the focusing system of the present invention until after the imaging apparatus is aligned above the integrated circuit site, the focusing system could continuously operate while the wafer moves. Thus, the focusing system would be continuously operating until the imaging apparatus becomes positioned above an integrated circuit site and thus achieve a quicker focus. Such a procedure would result in reductions of time necessary to fabricate the integrated circuits on the wafer and thus increase overall productivity. This procedure would also reduce the exposure time during the focusing process of any one portion of the photoresist layer and thus reduce the possibility of overexposure.

Some photolithographic tools use a scanning type of exposure process. In such a process, the mask and imaging apparatus move while exposing an image of the mask on each site as opposed to the step and repeat process mentioned above. The mask and imaging apparatus may move continuously or intermittently. The confocal focusing method of the present invention could be employed with this continuous process.

Figure 8A:
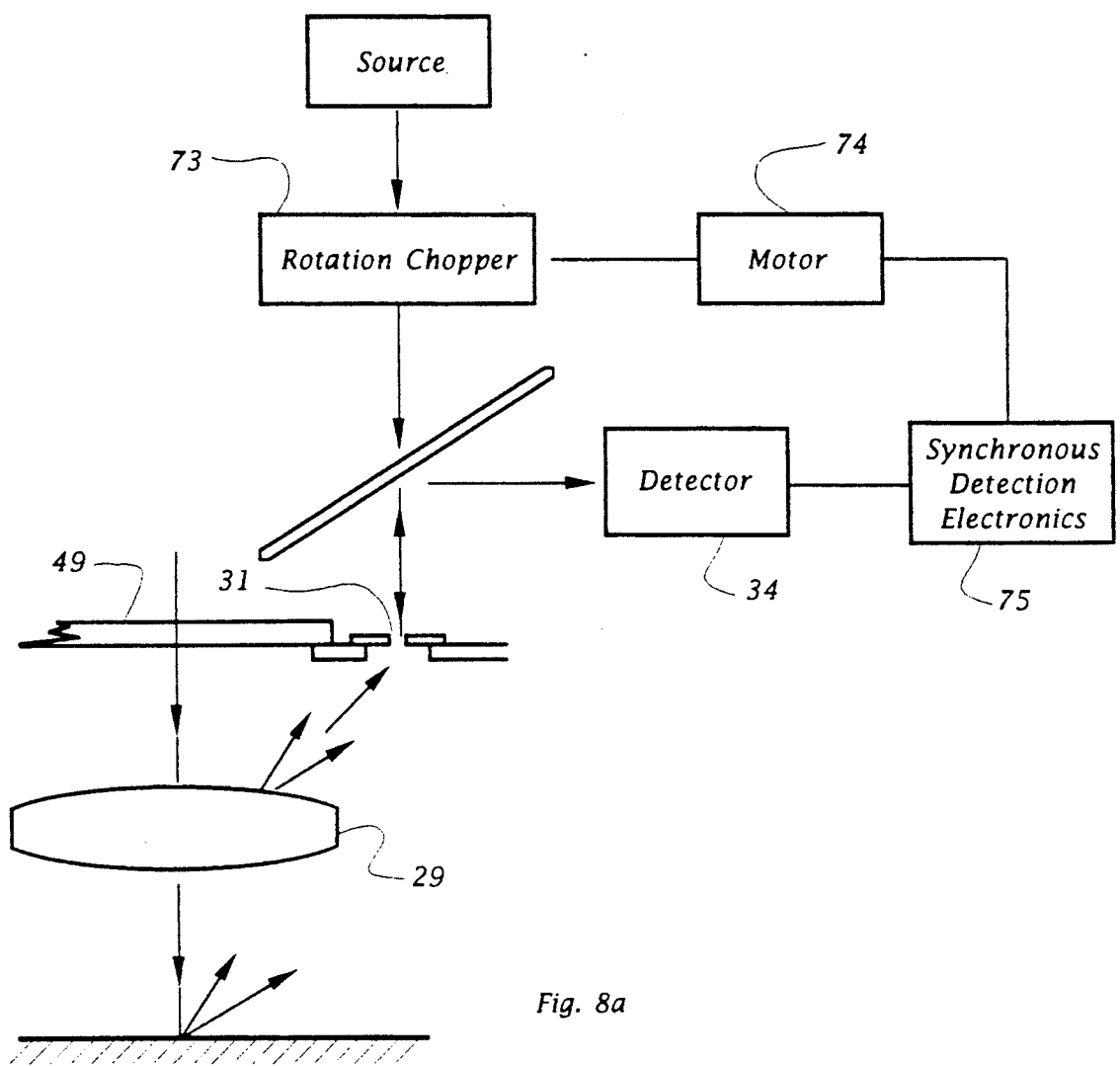
FIG. 8a illustrates a synchronous detection embodiment of the confocal focusing apparatus of the present invention.
Figure 8B:
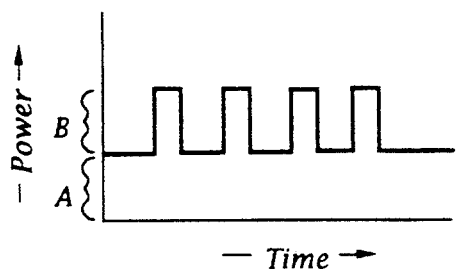
FIG. 8b provides a graph of power to time of radiation reflected back through the aperture of origin during operation of a continuous scanning projection lithographic device in which electromagnetic radiation projects through a subresolution aperture of a confocal imaging system in pulses.

A synchronous detection process provides one way for continuous real time use of the confocal focusing process during the actual exposure of the photoresist with a scanning or step and repeat type of imaging process. FIG. 8A provides a schematic diagram of an apparatus used for a continuous exposure scanning focus system. Rotating beam chopper 73 driven by motor 74 chops the projected beam of electromagnetic radiation up into pulses. Chopper 73 typically has alternating radiation transmitting and blocking sections. Consequently, detector 34 senses radiation output patterns as depicted on the graph in FIG. 8b. Portion "A" of the detected radiation results from some of the radiation scattered during the exposure of the photoresist reflecting through the aperture. Portion "B" of the detected radiation results from the pulses projected through aperture 31. The detector 34 in conjunction with conventional synchronous detection electronics 75 easily eliminates the effect of scattered radiation from the readings and makes a correct determination as to intensity of each pulse, thus ensuring proper focusing of the lithographic system. It will be readily apparent to those skilled in the art that methods other than beam chopping can provide radiation in pulses.

Figure 8C:
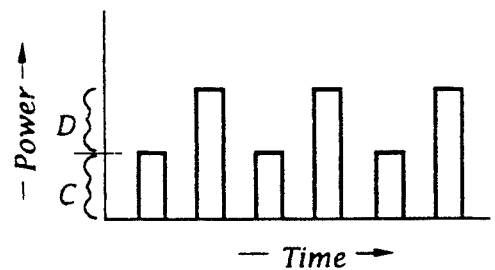
FIG. 8c provides a graph of the power to time of radiation reflected back through the aperture of origin during operation of a projection lithographic device in which an eximer laser provides the electromagnetic radiation for imaging.

Nowadays, eximer lasers are increasingly used in high resolution photolithography. These lasers emit radiation in a series of pulses making the standard techniques of chopping inappropriate for focus detection. One way of applying the confocal focusing technique of the present invention to such systems involves projection of the radiation through the aperture 31 at a rate different from that projected onto the mask. Given the different frequency rates, the system can isolate reflected radiation attributable to pulses projected through the aperture and accordingly focus the system. One such implementation would project radiation through the aperture with every other pulse of radiation projected onto the mask. FIG. 8c provides a graphic representation of the reflected radiation pulses sensed by the detector 34 under such a scheme. The detector easily isolates those portions "C" of every pulse attributable to mask projection radiation reflecting back through the aperture. The detector and associated electronics would then isolate the reflected radiation "D" originally projected through the aperture on every other pulse.

In the preferred embodiment described above, electromagnetic radiation of the same frequency creates the projected image of both the aperture of origin and the object to be imaged. Both the object and the aperture lie in the same plane and the same imaging device, such as a lens, images both. However, the system or method could be very easily altered so that electromagnetic radiation of different frequencies could image the object and the aperture. In such an arrangement the same imaging device would image both the aperture and object; however, the object and aperture would lie in different but adjacent planes to account for the difference in frequency of imaging radiation used to image the aperture and the object. The important factor is assuring the coincidence of the image plane of the object and the image plane of the aperture of origin to maintain the through-the-lens nature of the system or method. However, even when the object and the aperture are imaged by electromagnetic radiation of different frequencies, if the imaging device or lens is corrected for axial color, such that it can focus electromagnetic radiation of different frequencies to the same place or image plane, under the right circumstances the same lens can focus both the object and aperture to the same image plane even though they both lie in the same plane when imaged. An all reflective system can focus any number of different frequencies to the same plane.

As a further enhancement, the subresolution aperture(s) can be made to move, e.g. oscillate, with respect to the object plane in a direction generally perpendicular to the object plane, in order to determine the location of a surface relative to the image plane.

While the invention has been particularly shown and described with reference to preferred embodiments thereof, it will be understood by those skilled in the art that various changes in form and detail may be made therein without departing from the spirit and scope of the invention.

I claim:

1. Apparatus for projecting and focusing an image of an object to be patterned in an electromagnetic radiation sensitive layer, the image of the object being projected by object imaging means onto an imaging surface and the object being located in an object plane, comprising:
   first means for projecting electromagnetic radiation through the object imaging means and towards the imaging surface to pattern the electromagnetic radiation sensitive layer in conformity with the image of the object;
   an electromagnetic radiation barrier having a subresolution aperture therethrough;
   second means for projecting electromagnetic radiation through the aperture towards the imaging surface;
   confocal imaging means for forming from the projected radiation of said second means an image of said aperture in an image plane of the object imaging means, part of the projected radiation reflecting back from a localized region of the imaging surface through the confocal imaging means and the aperture;
   means for detecting power of radiation reflected back through the aperture; and
   means for adjusting the distance between the object imaging and the imaging surface to maximize said detected power.

2. The apparatus of claim 1 wherein the object comprises a projection lithography mask.

3. The apparatus of claim 2 wherein the imaging surface comprises a photoresist layer on a semiconductor wafer.

4. The apparatus of claim 3 wherein the localized region comprises sacrificial region of an integrated circuit site on the wafer.

5. The apparatus of claim 3 wherein the means for projecting radiation through the aperture comprises means for projecting radiation with an intensity below an exposure threshold of the photoresist layer.

6. The apparatus of claim 3 wherein the localized region comprises a kerf region between integrated circuit sites on the wafer.

7. The apparatus of claim 1 wherein the barrier having the subresolution aperture is located in the object plane.

8. The apparatus of claim 7 further comprising a plurality of subresolution apertures located in the object plane; means for projecting radiation through each of said apertures; confocal imaging means for forming an image of each of said apertures in the image plane of the object imaging means; and means for detecting the power of radiation reflected back through each of said apertures, whereby the distance between the object imaging means and the imaging surface can be adjusted to maximize the detected power of radiation reflected back through all of the apertures.

9. The apparatus of claim 8 wherein the plurality of subresolution apertures located in the object plane are closely spaced but reflectively separate, and wherein said detecting means comprises means for combining the detected reflected radiation from each of said apertures and for detecting power of the combined radiation, whereby the distance between the object imaging means and the imaging surface can be adjusted to maximize the detected power of the combined radiation.

10. The apparatus of claim 1 wherein the confocal imaging means comprises the object imaging means.

11. The apparatus of claim 1 wherein the radiation projected through the aperture comprises radiation from the same source as that used to image the object on the imaging surface.

12. The apparatus of claim 1 wherein the radiation projected through the aperture has a frequency equal to that of radiation used to form the image of the object.

13. The apparatus of claim 1 wherein the means for projecting radiation through the aperture and the detecting means share a common beam splitter.

14. The apparatus of claim 1 wherein the detecting means further comprises the means for distinguishing between reflected radiation originating from the aperture and other detected radiation.

15. The apparatus of claim 14 wherein the means for projecting radiation through the aperture comprises means for pulsing the projected radiation; and the detecting means comprises synchronous detection means synchronized with said pulsing means.

16. The apparatus of claim 15 wherein the means for projecting radiation through the aperture further comprises means for projecting the radiation in pulses at a rate different from but synchronized with a pulse rate of radiation used to project the image of the object.

17. The apparatus of claim 14, further comprising means for simultaneously projecting the image of the object onto the imaging surface and the electromagnetic radiation through the aperture towards the imaging surface.

18. The apparatus of claim 1, further comprising means for calibrating a nonconfocal focusing mechanism.

19. The apparatus of claim 18 wherein said nonconfocal focusing mechanism comprises one of: an oblique focusing system, a capacitance gauge and an air gauge.

20. The apparatus of claim 7 wherein the confocal imaging means comprises the object imaging means, and the radiation projected through the aperture has a frequency equal to the frequency of radiation used to form the image of the object.

21. Apparatus for projecting and focusing an image of an object to be patterned in an electromagnetic radiation sensitive layer, the image of the object being projected by object imaging means onto an imaging surface and the object being located in an object plane, comprising:

first means for projecting electromagnetic radiation through the object imaging means and towards the imaging surface to pattern the electromagnetic radiation sensitive layer in conformity with the image of the object;

an electromagnetic radiation barrier having a subresolution aperture therethrough;

second means for projecting electromagnetic radiation through the aperture towards the imaging surface;

confocal imaging means for forming from the projected radiation of said second means an image of said aperture in an image plane of the object imaging means;

means for directing projected radiation which strikes the imaging surface towards one of the aperture of origin and a conjugate subresolution aperture;

means for detecting power of directed radiation passing through the aperture of origin or the conjugate aperture; and means for adjusting the distance between the object imaging means and the imaging surface to maximize said detected power.

22. A method for projecting and focusing an image of an object to be patterned in an electromagnetic radiation sensitive layer, the image of the object being projected by object imaging means onto an imaging surface and the object being located in an object plane, comprising the steps of:

forming an image of a subresolution aperture in an image plane of the object imaging means;

bringing a localized region of the imaging surface into coincidence with the image of said aperture; and projecting electromagnetic radiation through the object imaging means and towards the imaging surface to pattern the electromagnetic radiation sensitive layer in conformity with the image of the object.

23. The method of claim 22 wherein the step of forming the image of the subresolution aperture comprises projecting electromagnetic radiation from the aperture through confocal imaging means; and wherein the step of bringing the image of the aperture and the imaging surface into coincidence comprises:

detecting power of radiation reflected back from the localized region of the imaging surface through the aperture, and adjusting the distance between the object imaging means and the imaging surface to maximize the detected power.

24. The method of claim 23 wherein the image of the aperture is formed by the object imaging means.

25. The method of claim 24 further comprising the steps of:
locating the aperture in the object plane; and
employing electromagnetic radiation of the same frequency to form the image of the aperture and the image of the object.

26. The method of claim 25 wherein the detecting step further comprises distinguishing between reflected radiation originally emanating from the aperture and other detected radiation.

27. The method of claim 25 wherein the object comprises a projection lithography mask, the imaging surface comprises a photoresist layer on a semiconductor wafer having multiple integrated circuit sites, and the localized region comprises a kerf region between adjacent integrated circuit sites.

28. The method of claim 25 further comprising the step of forming multiple subresolution aperture images in the image plane of the object imaging means.

29. A method for projecting and focusing an image of an object to be patterned in an electromagnetic radiation sensitive layer, the image of the object being projected by object imaging means onto an imaging surface and the object being located in an object plane, comprising:
projecting object exposure electromagnetic radiation through at least one subresolution aperture located in an electromagnetic radiation barrier in the object plane;
passing the radiation through the object imaging means to form an image of the aperture in an image plane of the object imaging means and then onto the imaging surface;
reflecting a portion of the radiation off the imaging surface so that it retraces its path back through the imaging means and the aperture;
detecting power of the radiation reflected back through the aperture;
adjusting the distance between the imaging surface and the object imaging means to maximize detected power of radiation; and
projecting electromagnetic radiation through the object imaging means and towards the imaging surface to pattern the electromagnetic radiation sensitive layer in conformity with the image of the object.

30. The method of claim 29 further comprising projecting the radiation through a plurality of subresolution apertures in the object plane and detecting power of radiation reflected back through each aperture; and adjusting the distance between the imaging surface and imaging device to maximize the detected power of radiation reflected back through each aperture.

31. The method of claim 29 further comprising projecting the radiation through a plurality of closely spaced but reflectively separate subresolution apertures in the object plane, detecting total power of radiation reflected back through the apertures; and adjusting said distance to maximize the detected total power of radiation.

32. A method for projecting and focusing an image of a mask to be patterned in a photoresist layer, the image of the mask being projected by object imaging means onto the photoresist layer during a photolithographic process comprising:
projecting mask exposure electromagnetic radiation through at least one subresolution aperture located in an electromagnetic radiation barrier located in the plane of the mask;
passing the radiation through an electromagnetic radiation imaging device onto the photoresist layer, the imaging device forming an image of the aperture in an image plane of the object imaging means;
reflecting a portion of the radiation off the photoresist layer so that it retraces its path back through the imaging means and the aperture;
detecting power of the radiation reflected back through the aperture;
adjusting the distance between the photoresist layer and the object imaging means to maximize detected power of radiation; and
projecting electromagnetic radiation through the object imaging means and towards the photoresist layer to pattern the electromagnetic layer in conformity with the image of the mask.

* * * * *

UNITED STATES PATENT AND TRADEMARK OFFICE
CERTIFICATE OF CORRECTION

PATENT NO. : 5,306,902
DATED : April 26, 1994
INVENTOR(S) : Goodman, Douglas S.

It is certified that error appears in the above-indentified patent and that said Letters Patent is hereby corrected as shown below:

Column 12, line 62, insert --means-- between "imaging" and "and".

Column 14, line 21, insert --of origin-- between "aperture" and "therethrough".

Column 14, line 23, insert --of origin-- between "aperture" and "towards".

Column 16, line 42, replace "electromagnetic" with "photoresist".

Signed and Sealed this

Sixteenth Day of August, 1994

Attest:

BRUCE LEHMAN

Attesting Officer

Commissioner of Patents and Trademarks